(12) United States Patent
Pan et al.

(10) Patent No.: US 8,160,404 B2
(45) Date of Patent: Apr. 17, 2012

(54) HIGH SPEED AND LOW LOSS GESI/SI ELECTRO-ABSORPTION LIGHT MODULATOR AND METHOD OF FABRICATION USING SELECTIVE GROWTH

(75) Inventors: Dong Pan, Andover, MA (US); Jifeng Liu, Cambridge, MA (US); Jurgen Michel, Arlington, MA (US); Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 290 days.

(21) Appl. No.: 11/561,474

(22) Filed: Nov. 20, 2006

(65) Prior Publication Data

US 2007/0116398 A1    May 24, 2007

Related U.S. Application Data

(60) Provisional application No. 60/738,845, filed on Nov. 22, 2005.

(51) Int. Cl.
*G02F 1/035*    (2006.01)
*G02B 6/12*    (2006.01)
*G02B 6/10*    (2006.01)

(52) U.S. Cl. ............... 385/2; 385/14; 385/129
(58) Field of Classification Search .......... 385/2
See application file for complete search history.

(56) References Cited

U.S. PATENT DOCUMENTS

| 7,368,062 | B2 * | 5/2008 | Ranganath et al. | 216/24 |
| 2003/0138178 | A1 * | 7/2003 | Kimerling et al. | 385/2 |
| 2005/0141801 | A1 | 6/2005 | Gardner | |
| 2006/0039666 | A1 * | 2/2006 | Knights et al. | 385/129 |
| 2010/0330727 | A1 * | 12/2010 | Hill et al. | 438/69 |

OTHER PUBLICATIONS

Baojun et al., "Monolithic integration of SiGe/Si modulator and multiple quantum well photodetector for 1.55 & mgr" Applied Physics Letters, American Institute of Physics, Melville NY, US, vol. 73, No. 24, Dec. 14, 1998, pp. 3504-3505, XP012021603.

Kesan et al., "Si/SIGE Heterostructures Grown on SOI substrates by MBE for integrated Optoelectronics" Journal of Crystal Growth, Elsevier, Amsterdam, NL, vol. 111, No. 1/4, May 2, 1991, pp. 936-942, XP000298474.

Schuppert et al., "Integrated optics in Silicon and SiGe-Heterostructures" Journal of Lightwave Technology, vol. 14, No. 10, Oct. 1996, pp. 2311-2323, XP011028675.

Kou et al., "Strong-quantum-confined Stark effect in germanium quantum-well structures on silicon" Nature Letters, vol. 437, Oct. 2005, pp. 1334-1336.

* cited by examiner

*Primary Examiner* — Uyen Chau N Le
*Assistant Examiner* — John M Bedtelyon
(74) *Attorney, Agent, or Firm* — Gesmer Updegrove LLP

(57) ABSTRACT

An optoelectronic device includes an input waveguide structure that receives an input optical signal. A GeSi/Si waveguide structure receives from the input waveguide the input optical signal and performs selective optoelectronic operations on the input optical signal. The GeSi/Si waveguide structure outputs an optical or electrical output signal associated with the selective optoelectronic operations performed on the input optical signal. An output waveguide structure receives the output optical signal from the GeSi/Si waveguide structure and provides the optical output signal for further processing.

17 Claims, 5 Drawing Sheets

HIGH SPEED AND LOW LOSS GESI/SI ELECTRO-ABSORPTION LIGHT MODULATOR AND METHOD OF FABRICATION USING SELECTIVE GROWTH

PRIORITY INFORMATION

This application claims priority from provisional application Ser. No. 60/738,845 filed Nov. 22, 2005, which is incorporated herein by reference in its entirety.

This invention was made with government support awarded by the Defense Advanced Research Projects Agency under Contract No. HR0011-05-C-0027. The government has certain rights in the invention.

BACKGROUND OF THE INVENTION

The invention relates to the field of optical modulators, and in particular to a high speed and low loss GeSi/Si electro-absorption light modulator.

Si-based modulators are highly required for photonic integrated circuits. However, the indirect bandgap of Si prevent any electric-field induced light modulation. Ge-rich GeSi (Ge composition>50%) devices grown on Si are becoming more utilized because of the relatively small difference between the indirect and direct bandgaps of Ge, which can address some of the difficulties Si devices have faced. However, adequate device design and fabrication are very important in forming EA modulators which work efficiently.

There are several challenges in making workable GeSi/Si modulators. The key goal of GeSi based electro-absorption (EA) modulators is to achieve lowest possible loss at voltage off-state with highest possible extinction ratio at voltage on-state. Because GeSi EA modulators inevitably have material loss due to the absorption of indirect band gap, the length of GeSi active region has to be very short, typically less than the order of ~150 μm, to achieve low insertion loss at off-sate. Therefore, it has to be coupled to a low loss waveguide, such as Si or $SiN_x$ wavguides, for on-chip applications. Since $GeSi/SiO_2$ material system has a high index contrast and its single mode dimensional is very small (the single mode cut-off dimension is less than 1 μm), it is a big challenge to achieve an efficient waveguide-modulator coupling. Another issue is that standard reactive ion etching (RIE) of GeSi material usually results in rough sidewalls that increases the scattering loss in the GeSi EA modulator. It would be desirable to circumvent this issue.

SUMMARY OF THE INVENTION

According to one aspect of the invention, there is provided an optoelectronic device on Si or SOI wafer. The optoelectronic device includes an input waveguide structure that receives an input optical signal. A GeSi/Si waveguide structure receives from the input waveguide the input optical signal and performs selective optoelectronic operations on the input optical signal. The GeSi/Si waveguide structure outputs an optical or electrical output signal associated with the selective optoelectronic operations performed on the input optical signal. An output waveguide structure receives the output optical signal from the GeSi/Si waveguide structure and provides the optical output signal for further processing.

According to another aspect of the invention, there is provided a method of forming an optoelectronic device. The method includes providing a Si or SOI substrate and forming on the substrate an input waveguide structure that receives an input optical signal. A GeSi/Si waveguide structure is formed that receives from the input waveguide the input optical signal and performs selective optoelectronic operations on the input optical signal. The GeSi/Si waveguide structure outputs an optical or electrical output signal associated with the selective optoelectronic operations performed on the input optical signal. Also, the method includes forming an output waveguide structure that receives the output optical signal from the GeSi/Si waveguide structure and provides the output optical signal for further processing.

According to another aspect of the invention, there is provided a monolithically integrated optoelectronic circuit on Si or SOI wafer. The optoelectronic circuit includes an input waveguide structure that transmits an input optical signal and a GeSi/Si waveguide structure that receives from the input waveguide the input optical signal and modulates the input optical signal. An output waveguide structure receives the modulated optical signal from the GeSi/Si waveguide structure and transfers the modulated optical signals for further processing. An optoelectronic function module receives the modulated optical signals from the output waveguide structure and performs optoelectronic functions such as demultiplexing or filtering. A second GeSi/Si waveguide structure receives the optical signal from the optoelectronic function module and converts it to electrical signals to be processed by an electronic integrated circuit.

DETAILED DESCRIPTION OF THE INVENTION

Figure 1:
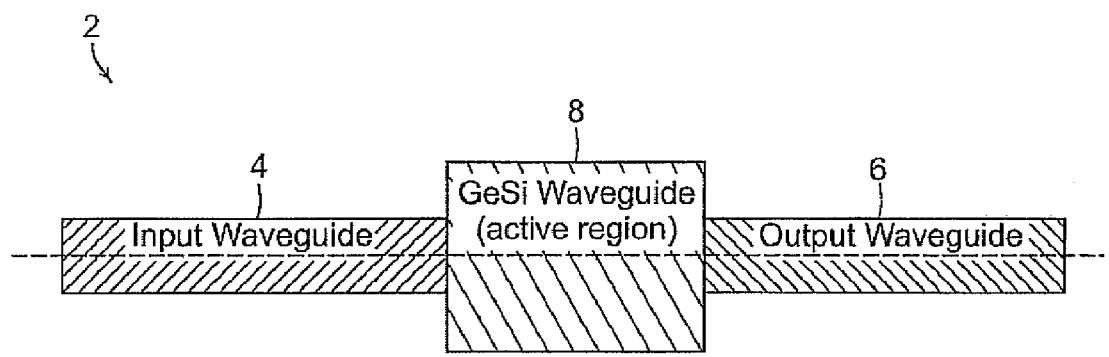
FIG. 1 is a schematic diagram demonstrating the basic concept of the invention.

FIG. 1 illustrates the basic concept of the invention. The inventive optical modulator 2 generally comprises an input waveguide 4, an output waveguide 6, and a modulator waveguide structure 8. Sturcture 8 is the active light modulation region of the device. The input waveguide 4 and the output waveguide 6 can comprise Si, $SiN_x$ or $SiO_xN_y$ waveguides. The modulator waveguide structure 8 can comprise Ge or GeSi with adequate composition. The composition of the GeSi material is chosen such that the relative change in the absorption coefficient at the on-state compared to the off-state (i.e., $|\alpha_{on}-\alpha_{off}|/\alpha_{off}$, where $\alpha_{on}$ and $\alpha_{off}$ are the absorption coefficients of GeSi at on and off states, respectively) is maximized around the operating wavelength. One of the advantages of this invention is the ability to integrate the components 4, 6 and 8 together with high efficiency butt-coupling. The invention relies on the fact that the off-state of the modulator is operated at relatively low absorption regime of the GeSi material and the length of modulator waveguide 6 is less than the order of ~150 μm so as to keep a low absorption loss at off-state. The on-state is operated with a high electric field applied on the GeSi material to change its absorption coefficient and create enough extinct ratio for light modulation at on-state.

Figure 2:
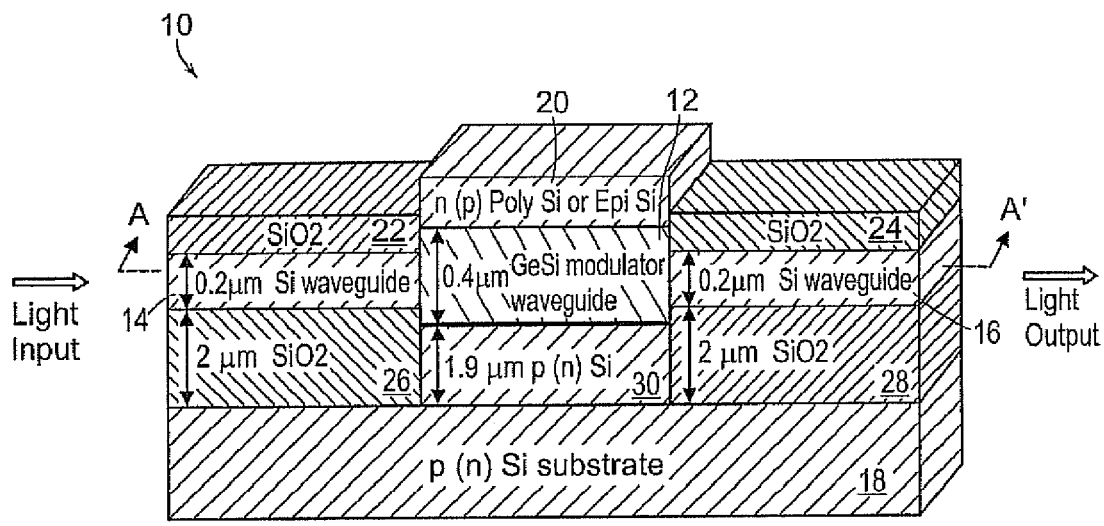
FIG. 2 is a schematic diagram demonstrating an example of an electro-absorption (EA) based optical modulator that includes a short Si/GeSi/Si p-i-n diode waveguide structure.
Figure 2:
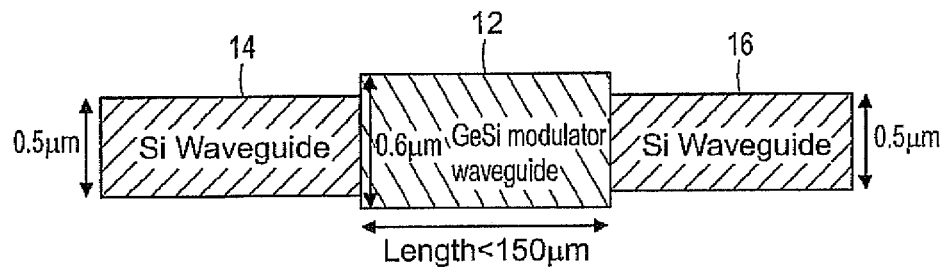

FIG. 2 illustrates an example of an electro-absorption (EA) based optical modulator 10 that includes a very short GeSi-based waveguide 12. The optical modulator includes the GeSi modulator waveguide 12, an input waveguide 14, an output waveguide 16, a p(or n)-type Si substrate 18, an n(or p)-type poly-Si or epitaxial Si layer 20, and various $SiO_2$ layers 22, 24, 26, 28. Basically, the p(n)-type Si mesa 30, the GeSi modulator waveguide 12 and the n(p)-type poly-Si or epitaxial Si layer 20 form a Si/GeSi/Si p-i-n diode waveguide structure, which allows a high electric field to be applied on the GeSi active layer 12 at reverse bias. The applied electric field significantly changes the absorption coefficient of the GeSi material at the operating wavelength so that the intensity of the input light can be modulated. In this embodiment, the cross-section perpendicular to the light propagation direction of the input and output waveguides 14 and 16 is 0.5×0.2 μm, but it can be varied as long as they keep single mode. The cross-section perpendicular to the light propagation direction of the GeSi modulator waveguide 12 is 0.6 μm×0.4 μm, but the dimension can vary to achieve optimal coupling efficiency with the input and output waveguides, 14 and 16. In this embodiment, the input waveguide 14 and output waveguide 16 comprise Si. However, they can also comprise $SiO_xN_y$ or $SiN_x$ waveguides. The input/output waveguides 14 and 16 are butt-coupled to the GeSi modulator waveguide 12. One great advantage of butt coupling is that the coupling efficiency is high, greater than 90% when input and output waveguides 14 and 16 comprise Si. The thickness of the bottom $SiO_2$ layers 26 and 28 is 2 μm, however, in other embodiments the size can also vary as long as the light in waveguides 12, 14 and 16 do not leak to the substrate. The blocks of $SiO_2$ layers 22, 24, 26, and 28 can also be substituted with other dielectric materials like $SiO_xN_y$ or $SiN_x$, as long as the refractive indexes of the materials in blocks 22, 24, 26 and 28 are smaller than the core materials of input and output waveguides 14 and 16. The poly Si or epi-Si layer 20 and the Si mesa 30 have opposite types of doping, i.e., if the former is n-type, the latter is p-type, and visa verse. The Si substrate 18 can also be substituted with SOI substrate, as will be described later.

The Si/GeSi/Si p-i-n diode waveguide modulator off-state is operated at 0 bias or a small forward bias with low electric field in the GeSi active material. At the off-state, the GeSi modulator 12 has an absorption coefficient of approximately 100/cm, but the length of the GeSi modulator waveguide 12 is kept short (<150 μm) such that a low insertion loss of <4 dB can be achieved. The on-state is operated at a reverse bias with a high electric field in the GeSi active layer to significantly change its absorption coefficient at the operating wavelength for a high extinct ratio (~10 dB) of light modulation. The composition of the GeSi material is chosen such that the relative absorption coefficient change at the on-state compared to the off-state (i.e., $|\alpha_{on} - \alpha_{off}|/\alpha_{off}$) is maximized around the operating wavelength.

The GeSi modulator waveguide structure 12 can be multimode, where the dimensions of Ge modulator waveguide structure 12 is larger than its single mode cut-off dimension. Larger feature sizes make fabrication easier. Though the GeSi modulator waveguide structure 12 is multimode, the operation of the modulator can keep single mode. In order to achieve this, the input waveguide 14 and output waveguide 16 have to be center aligned and butt-coupled to the GeSi modulator waveguide structure 12 to only excite the fundamental mode in the GeSi modulator waveguide 12.

Figure 3:
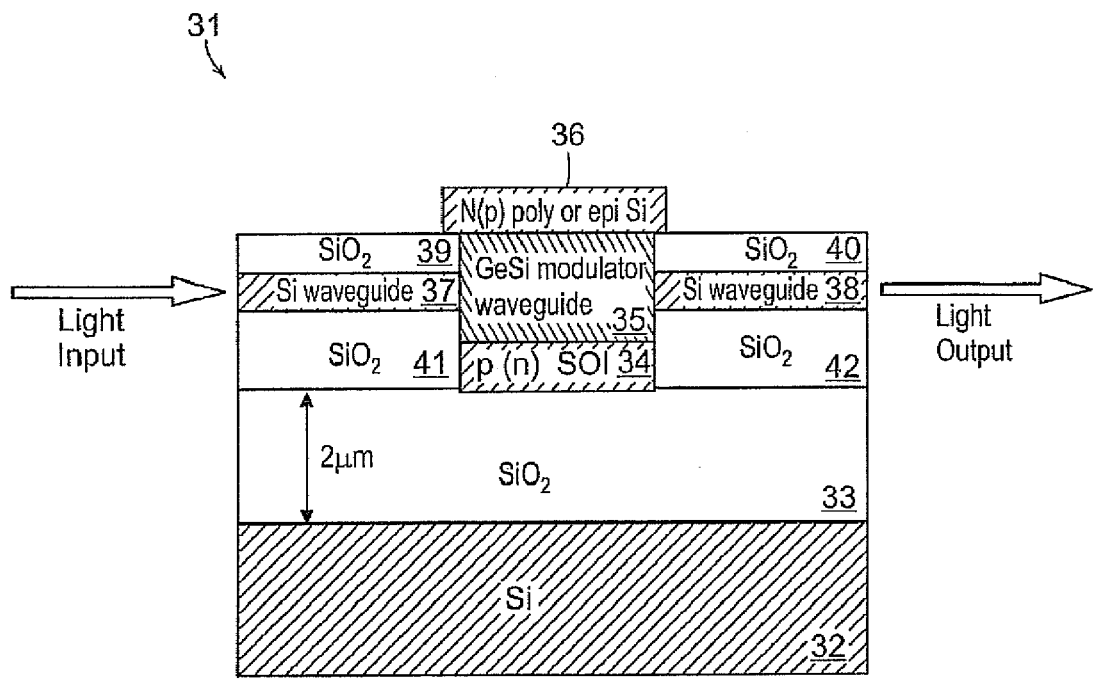
FIG. 3 is a schematic diagram demonstrating another embodiment of the inventive modulator structure.

FIG. 3 illustrates another embodiment of the inventive modulator structure 31 on an SOI substrate. The modulator 31 includes an SOI substrate comprising of a bottom Si substrate 32, a $SiO_2$ insulator layer 33 and a p(n)-type silicon layer on insulator 34. The modulator 31 further includes a Ge or GeSi modulator waveguide structure 35, an n(p)-type Si layer 36 on top of the GeSi modulator waveguide, an input waveguide 37 and an output waveguide 38 that are butt coupled to the GeSi modulator waveguide 35, and $SiO_2$ blocks 39, 40, 41, and 42. The thickness of the $SiO_2$ layer 33 in the SOI wafer is 2 μm in this embodiment, but it can be adjusted to other thicknesses as long as the light in waveguides 35, 37 and 38 does not leak to the substrate 32. The dimensions of GeSi modulator waveguide 35, the input waveguide 37 and the output waveguide 38 are the same as the corresponding waveguides 12, 14 and 16 in FIG. 2, respectively. The n-type Si layer 36 on top of the GeSi modulator waveguide can be changed to p-type, and in that case the Si layer on insulator 34 at the bottom of the GeSi modulator waveguide should be n-type. The input and output waveguides 37 and 38 comprise Si waveguides in this embodiment. However, they can also comprise $SiO_xN_y$ or $SiN_x$ waveguides. The $SiO_2$ blocks 39, 40, 41 and 42 can also be can also be substituted with other dielectric materials like $SiO_xN_y$ or $SiN_x$, as long as the refractive indexes of the materials in blocks 39, 40, 41 and 42 are smaller than the core materials of input and output waveguides 37 and 38.

In addition, the same inventive optoelectronic device can also be used as a butt-coupled GeSi detector structure. The only difference is that the Si/GeSi/Si p-i-n diode waveguide structure in the photodetector device is usually longer than that in the modulator device in order to increase light absorption. At reverse bias, the electrons and holes excited by the absorbed photons are accelerated by the electric field applied on the GeSi layer through the Si/GeSi/Si p-i-n diode waveguide structure, and are collected by the electrodes. This way, optical signals are transformed into electrical ones for further processing in an electronic integrated circuit.

Figure 4:
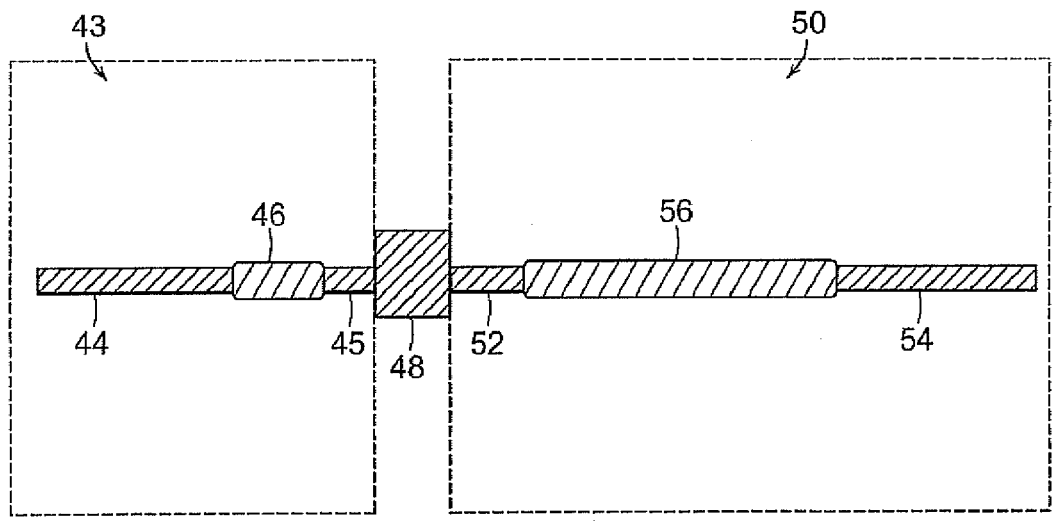
FIG. 4 is a schematic diagram illustrating an embodiment of the invention where the inventive GeSi EA modulator, waveguide and GeSi photodetector are integrated.

FIG. 4 illustrates an embodiment of the invention where a monolithically integrated optoelectronic circuit is formed, including a GeSi EA modulator, a GeSi photodetector, waveguides and other optoelectronic function module. In this embodiment, the modulator structure 43 comprises an input waveguide structure 44, an output waveguide structure 45, and a GeSi modulator waveguide structure 46. The output waveguide 45 is coupled to an optoelectronic function module 48. The detector 50 comprises an input waveguide 52, an output waveguide 54, and a GeSi photodetector structure 56. In some cases the output waveguide of the photodetector 54 is not necessary and can be omitted. Note the GeSi detector waveguide structure 56 is almost the same as the GeSi modulator waveguide structure 46 except that the length of the GeSi detector waveguide structure 56 can be longer. The GeSi EA modulator and photodetector are of exactly the same GeSi material, so they can be formed together in a single selective growth of GeSi in pre-defined regions exposed on Si or SOI substrate. This design greatly simplifies the fabrication process of modulator/waveguide/photodetector integration, which is another big advantage of this invention.

In other embodiments, the optical function module 48 is not needed and there is a direct connection from the modulator 43 to the detector 50. In that case, the output waveguide 45 of the optical modulator 43 becomes the input waveguide 52 of the detector 50. Also, the input waveguides 44, 52 and output waveguides 45, 54 can comprise Si, $SiO_xN_y$, or $SiN_x$ waveguides.

Figure 5:
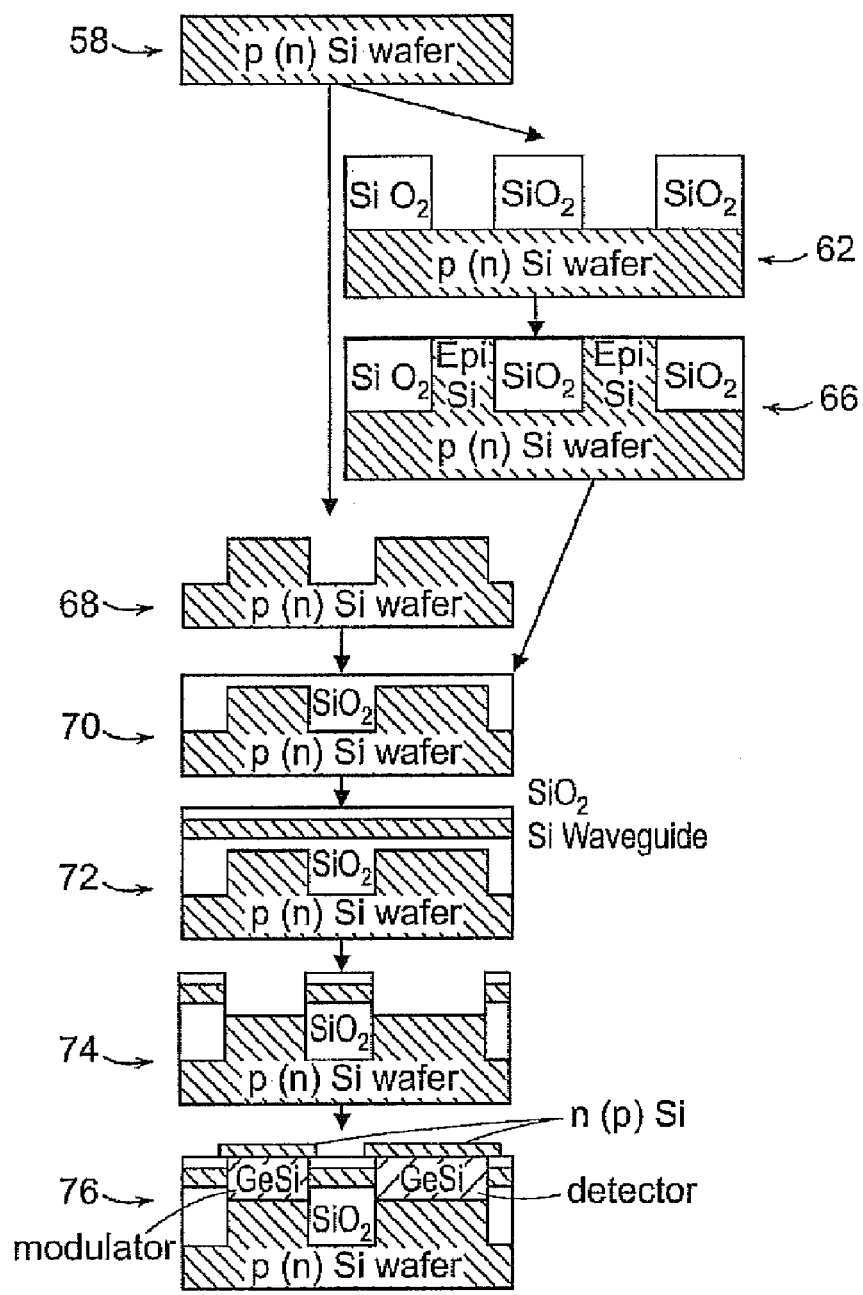
FIG. 5 is a flowchart demonstrating an example of the steps in fabricating and integrating the inventive modulator and photodetector devices on a Si substrate.

FIG. 5 demonstrates an example of the steps in fabricating the inventive optical modulator and photodetector devices on a Si substrate. There is provided a p or n type Si substrate, as shown in step 58. Si mesas can be formed on the Si substrate by etching part of the wafer via lithography, as shown in step 68. Then an oxide layer is deposited on the etched Si wafer and the surface can be planarized by chemical mechanical polishing (CMP), shown in step 70. In other embodiments, these dielectric layers can also comprise other materials like $SiO_xN_y$, or $SiN_x$. Alternatively, the structure in step 70 can be formed by selective growth of Si. In that case, an oxide layer is grown on the Si wafer and patterned by lithography, as shown in step 62. Then, epitaxial Si with the same type of doping as the Si substrate can be grown in the area where the Si substrate is exposed, as shown in step 66. The top of the Si mesa can be planarized by CMP if necessary. The doping of Si epitaxial layer can be achieved either by in situ doping during the growth or ex situ by ion implantation. After step 66, an oxide layer can be deposited on the top to form the structure in step 70. In other embodiments, these dielectric layers can also comprise other materials like $SiO_xN_y$, or $SiN_x$. From step 70, we deposit a layer of Si and pattern it into the cores of Si waveguides. In other embodiments, these waveguide cores can also comprise $SiO_xN_y$ or $SiN_x$ as long as its refractive index is larger than the cladding material. Then an oxide layer is deposited on top to form the upper cladding of Si waveguide, followed by CMP planarization (see step 72). In other embodiments, this upper cladding layer can also comprise other materials like $SiO_xN_y$, or $SiN_x$. Trenches are subsequently etched into this structure to expose the tops of said Si mesas, shown in step 74. Then GeSi material is selectively grown into these trenches and the top is planarized by CMP. A Si layer with opposite type of doping to the Si substrate is further deposited and patterned on top of the structure, as shown in step 76. Metal electrodes can be used to contact the doped Si regions on tops and bottoms of the GeSi waveguides. The shorter GeSi waveguides are used as modulators, while the longer ones following them are used as photodetectors. A great advantage is that the modulators and photodetectors are of the same GeSi material and can be grown at the same time, which greatly simplifies the fabrication process of modulator/waveguide/photodetector monolithic integration. Furthermore, the fabrication method presented here provides integrated modulators, waveguides and photodetectors on a Si wafer, an important step to the integration of optical and electrical components on Si platform.

Figure 6:
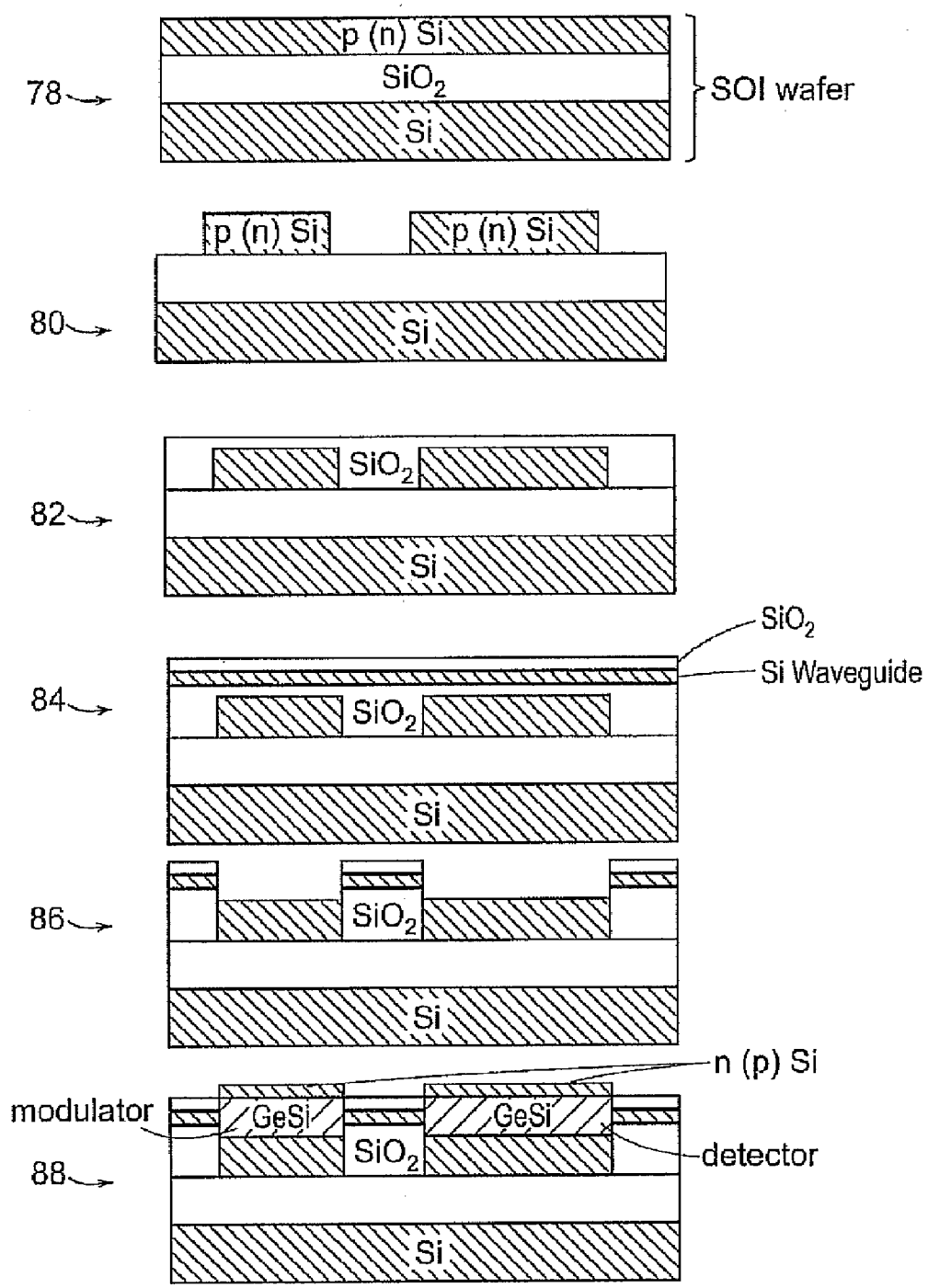
FIG. 6 is a flowchart demonstrating an example of the steps in fabricating and integrating the inventive modulator and photodetector devices on a Si on insulator (SOI) substrate.

FIG. 6 demonstrates an example of the steps in fabricating the inventive optical modulator and photodetector devices on a SOI substrate. There is provided a SOI substrate, with the top Si layer doped p or n type, as shown in step 78. Si mesas are then formed by patterning the top Si layer on the $SiO_2$ insulator layer, shown in step 80. An oxide layer is deposited on top of the structure and planarized by CMP, as shown in step 82. In other embodiments, this dielectric layer can also comprise other materials like $SiO_xN_y$, or $SiN_x$. We deposit a layer of Si and pattern it into the cores of Si waveguides. In other embodiments, these waveguide cores can also comprise $SiO_xN_y$ or $SiN_x$ as long as its refractive index is larger than the cladding materials. Then an oxide layer is deposited on top to form the upper cladding of the Si waveguides, followed by CMP planarization, as shown in step 84. In other embodiments, this upper cladding layer can also comprise other materials like $SiO_xN_y$, or $SiN_x$. Trenches are subsequently etched into this structure to expose the tops of the Si mesas, shown in step 86. Then GeSi material is selectively grown into these trenches and the top is planarized by CMP. A Si layer with opposite type of doping to the Si mesas underneath GeSi waveguide structures is further deposited and patterned on top of the structure, as shown in step 88. Metal electrodes can be used to contact the doped Si regions on tops and bottoms of the GeSi waveguide structures. The shorter GeSi waveguides are used as modulators, while the longer ones following them are used as photodetectors. In this way, monolithic integration of waveguides, GeSi modulators and GeSi photodetectors can be achieved.

Although the present invention has beeen shown and described with respect to several preferred emobodiments thereof, various changes, omissions and additions to the form and detail thereof, may be made therein, without departing from the spirit of the scope of the invention.

What is claimed is:

1. An optoelectronic device on Si or SOT wafer comprising:
    a substrate;
    an on-chip input waveguide structure that receives an input optical signal;
    a GeSi/Si waveguide structure having a GeSi absorption region which is in contact with and directly butt-coupled to said on-chip input waveguide, said GeSi/Si waveguide structure receives the input optical signal and performs optical modulation at reverse bias on the input optical signal based on Franz-Keldysh effect, the GeSi/Si waveguide structure outputs an output optical signal associated with the optical modulation operations performed on said input optical signal;
    an on-chip output waveguide structure that is directly butt-coupled to and in contact with said GeSi absorption region, receives the output optical signal and provides said optical output signal for further processing, said on-chip input waveguide structure and said on-chip output waveguide structure each having a first dielectric layer, said first dielectric layers being directly positioned on said substrate, said on-chip input waveguide structure and said on-chip output waveguide structure each comprising a core being directly positioned on said first dielectric layers and a second dielectric layer being directly positioned on said on-chip input waveguide structure and said on-chip output waveguide structure; and
    a first doped semiconductor layer having a selective doping type positioned on the GeSi absorption region and a second doped semiconductor layer positioned on another side of said GeSi absorption region having an opposite doping type from said selective doping type to allow electric fields to be applied to the GeSi absorption region at reverse bias; wherein
    said first doped semiconductor layer being directly positioned on said substrate, said GeSi absorption region being directly positioned on said first doped semiconductor layer and said second semiconductor layer being directly positioned on said GeSi absorption region.

2. The optoelectronic device of claim 1, wherein said input waveguide comprises a single mode Si waveguide, a $SiO_xN_y$ waveguide, or a $SiN_x$ waveguide.

3. The optoelectronic device of claim 1, wherein said output waveguide comprises a single mode Si waveguide, a $SiO_xN_y$ waveguide, or a $SiN_x$ waveguide.

4. The optoelectronic device of claim 1, wherein said GeSi/Si waveguide structure comprises a width and a height providing modal overlap with the input and output waveguides.

5. The optoelectronic device of claim 4, wherein said GeSi/Si waveguide structure comprises selectively grown, single crystal GeSi.

6. The optoelectronic device of claim 1, wherein the centers of optical modes in the input waveguide structure, the output waveguide structure and the GeSi/Si waveguide structure are aligned.

7. The optoelectronic device of claim 1, said input and output waveguide structures comprise $SiO_2$ or $SiO_xN_y$ to form a cladding.

8. The optoelectronic device of claim 1, wherein said optoelectronic device defines a butt-coupled photodetector.

9. A method of forming an optoelectronic device comprising:
providing a substrate,
forming on said substrate an on-chip input waveguide structure that receives an input optical signal;
forming a GeSi/Si waveguide structure having a GeSi absorption region which is in contact with and directly butt-coupled to said on-chip input waveguide, said GeSi/Si waveguide structure receives the input optical signal and performs optical modulation at reverse bias on the input optical signal based on Franz-Keldysh effect, the GeSi/Si waveguide structure outputs an output optical signal associated with the optical modulation operations performed on said input optical signal;
forming an on-chip output waveguide structure that is directly butt-coupled to and in contact with said GeSi absorption region the output waveguide structure receives said output optical signal, and provides said output optical signal for further processing, said on-chip input waveguide structure and said on-chip output waveguide structure each having a first dielectric layer, said first dielectric layers being directly positioned on said substrate, said on-chip input waveguide structure and said on-chip output waveguide structure each comprising a core being directly positioned on said first dielectric layers and a second dielectric layer being directly positioned on said on-chip input waveguide structure and said on-chip output waveguide structure; and
forming a first doped semiconductor layer having a selective doping type positioned on the GeSi absorption region and a second doped semiconductor layer positioned on another side of said GeSi absorption region having an opposite doping type from said selective doping type to allow electric fields to be applied to the GeSi absorption region at reverse bias; wherein
said first doped semiconductor layer being directly positioned on said substrate, said GeSi absorption region being directly positioned on said first doped semiconductor layer and said second semiconductor layer being directly positioned on said GeSi absorption region.

10. The method of claim 9, wherein said input waveguide comprises a single mode Si waveguide, a $SiO_xN_y$ waveguide, or a $SiO_x$ waveguide.

11. The method of claim 9, wherein said output waveguide comprises a single mode Si waveguide, a $SiO_xN_y$ waveguide, or a $SiN_x$ waveguide.

12. The method of claim 9, wherein said GeSi/Si waveguide structure comprises a width and a height providing modal overlap with the input and output waveguides.

13. The method of claim 12, wherein said GeSi/Si waveguide structure comprises selectively grown, single crystal GeSi.

14. The method of claim 9, wherein the centers of optical modes in the input waveguide structure, the output waveguide structure and the GeSi/Si waveguide structure are aligned.

15. The method of claim 9, wherein said input and output waveguide structures comprise $SiO_2$ or $SiO_xN_y$ to form a cladding.

16. The method of claim 9, wherein said optoelectronic device defines a butt-coupled photodetector.

17. A monolithically integrated optoelectronic circuit on Si or SOI wafer comprising:
an on-chip input waveguide structure that transmits an input optical signal;
a GeSi/Si waveguide structure, said GeSi/Si waveguide structure has a GeSi absorption region which is directly butt-coupled to said on-chip input waveguide; said GeSi/Si waveguide structure receives the input optical signal and performs optical modulation at reverse bias on the input optical signal based on Franz-Keldysh effect;
an on chip output waveguide structure that is directly butt-coupled to and in contact with said GeSi absorption region that receives the modulated optical signal from said GeSi/Si waveguide structure and transfers said modulated optical signals for further processing, said on-chip input waveguide structure and said on-chip output waveguide structure each having a first dielectric layer, said first dielectric layers being directly positioned on said substrate, said on-chip input waveguide structure and said on-chip output waveguide structure each comprising a core being directly positioned on said first dielectric layers and a second dielectric layer being directly positioned on said on-chip input waveguide structure and said on-chip output waveguide structure;
a first doped semiconductor layer having a selective doping type positioned on the GeSi absorption region and a second doped semiconductor layer positioned on another side of said GeSi absorption region having an opposite doping type from said selective doping type to allow electric fields to be applied to the GeSi absorption region at reverse bias, said first doped semiconductor layer being directly positioned on said substrate, said GeSi absorption region being directly positioned on said first doped semiconductor layer and said second semiconductor layer being directly positioned on said GeSi absorption region;
an optoelectronic function module that receives the modulated optical signals from said output waveguide structure and performs optoelectronic functions; and
a second GeSi/Si waveguide structure with the same GeSi composition and device structure as said first GeSi/Si waveguide structure that receives the optical signal from said optoelectronic function module via butt-coupling and outputs said optical signal for further processing.

* * * * *